United States Patent [19]

Kohler

[11] 4,172,235

[45] Oct. 23, 1979

[54] THIN FILM MAGNETOMETER INSENSITIVE TO SPIN

[75] Inventor: Hans W. Kohler, Washington, D.C.

[73] Assignee: The United States of America as represented by the Secretary of the Army, Washington, D.C.

[21] Appl. No.: 722,490

[22] Filed: Apr. 18, 1968

[51] Int. Cl.$^2$ ............................................. G01R 33/02
[52] U.S. Cl. .................................................. 324/249
[58] Field of Search ............................ 324/43, 47, 249

[56] References Cited

U.S. PATENT DOCUMENTS

| 3,218,547 | 11/1965 | Line | 324/43 |
|---|---|---|---|
| 3,271,665 | 9/1966 | Castro et al. | 324/43 |

FOREIGN PATENT DOCUMENTS 592241  12/1947  United Kingdom ...................... 324/43

Primary Examiner—Theodore M. Blum
Attorney, Agent, or Firm—Nathan Edelberg; Robert P. Gibson; Saul Elbaum

[57] ABSTRACT

A thin film magnetometer is disclosed, adapted to detect changes in the earth's magnetic field, but which is insensitive to apparent changes in the field as result from spin of the magnetometer relative to the field. Insensitivity to spin is obtained by forming the thin film sensor as a loop having a plane of symmetry in which the axis of spin lies.

6 Claims, 6 Drawing Figures

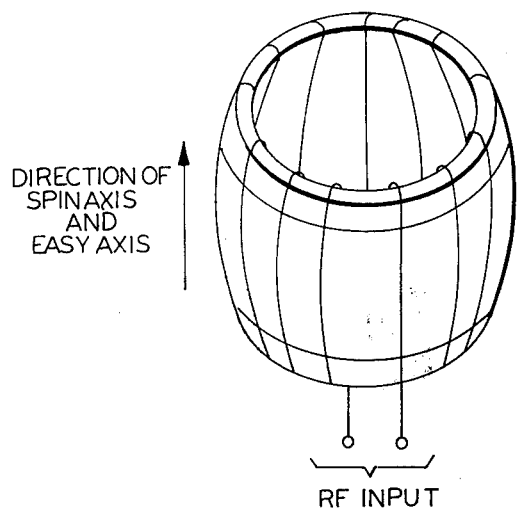
DIRECTION OF SPIN AXIS AND EASY AXIS
RF INPUT
FIG. 4
FIG. 5
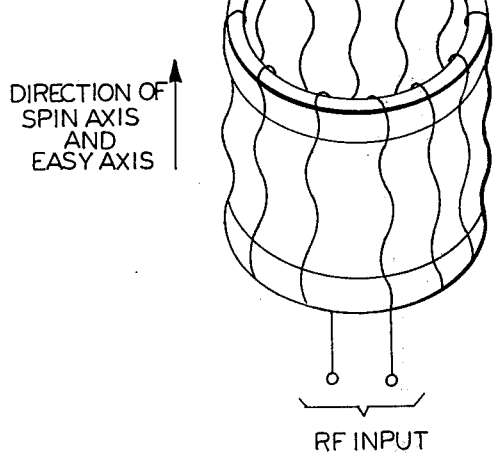
DIRECTION OF SPIN AXIS AND EASY AXIS
RF INPUT
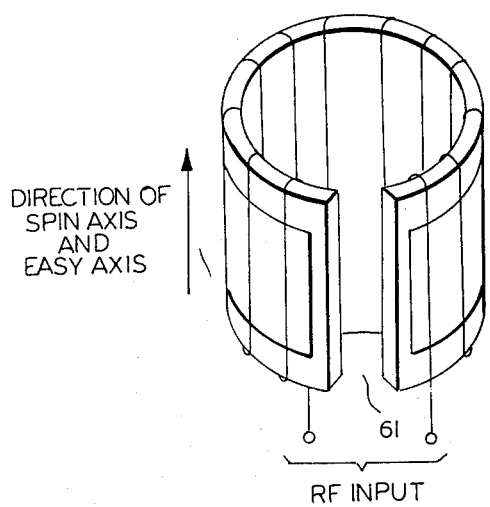
DIRECTION OF SPIN AXIS AND EASY AXIS
FIG. 6
61
RF INPUT

THIN FILM MAGNETOMETER INSENSITIVE TO SPIN

The present invention relates to thin film magnetometers, and to the use of such devices for sensing changes in the earth's magnetic field as may result from the movement of metallic structures in close proximity to the magnetometer.

Thin film magnetometers are known in the art, and examples are contained in U.S. Pat. Nos. 3,227,944 to Turner E. Hasty and 3,271,665 to Peter S. Castro, et al. The thin film of magnetic material that characterizes these devices comprises a vapor deposited film of ferromagnetic material having a thickness of substantially a single domain. This thin film possesses the property of uniaxial anisotropy in the plane of the film, having a preferred magnetization vector along one axis of the film, known as the easy axis of magnetization; the axis at right angles to the easy axis in the plane of the film is known as the hard axis. To utilize the thin film as a magnetic field sensor, a coil is wound about the film with the hard axis as the axis of the coil, so that the film provides a core for the coil. If the coil is then energized with an alternating current, preferably a high frequency or radio frequency current, the inductance value of the coil is a function of the external or ambient magnetic field to which the film is exposed. Thus, changes in the external magnetic field are registered as changes in the voltage drop across the coil.

These devices are sufficiently sensitive to changes in ambient magnetic field that they can be used as sensors for military explosive land mines and like devices. For example, the proximate presence of a moving tank or other metal vehicle affects the earth's magnetic field sufficiently to provide a significant change in the inductance value of the coil, and this change can be utilized as a trigger for firing the explosive charge of a mine.

Heretofore, it has been the practice to fabricate the thin magnetic film as a substantially flat planar film, and this configuration is effective and acceptable for the above-described purposes once the mine and its sensor are implanted and stationary. However, in accordance with present practices, it is desired to be able to distribute these mines over an area by air drop, and in so doing it is conventional to stabilize the mine in its descent by means of a spin. As will be apparent to those skilled in the art, and as will be further explained subsequently, the spin of the mine causes a cyclically changing orientation of the thin film sensor relative to the earth's magnetic field, and this effect causes a cyclically changing inductance value for the coil associated with the magnetic film. As a result, a false firing signal might be obtained from the sensor.

In accordance with the present invention, the probability of a false firing signal caused by spin in the earth's magnetic field is essentially eliminated, or at least largely minimized. This result is obtained basically by forming the film in a configuration that possesses the characteristic of substantial axial symmetry, and orienting the film so that its axis of symmetry is substantially parallel with the axis of spin. Pursuant to a preferred form of the invention, the magnetic film is formed in a closed or endless cylindrical loop configuration with the coil wound toroidally thereon, and the unit is then oriented in the mine structure so that the planned axis of spin of the mine is substantially parallel with the cylindrical axis of the film. By this technique, the magnetic effect of the spin on the domains of the thin film is substantially constant.

It is therefore one object of the present invention to provide a thin film magnetometer.

Another object of the invention is to provide such a magnetometer which is essentially insensitive to changes in its orientation about one axis thereof, relative to the magnetic field in which it is operating.

Another object of the present invention is to provide a thin film magnetometer which will sense changes in the earth's magnetic field, and provide an indication of such changes.

And still another object of the present invention is to provide such a magnetometer which is substantially insensitive to apparent changes in the earth's magnetic field as would result from a spinning movement of the unit about a selected spin axis.

A still further object of the present invention is to provide a thin film magnetometer as the firing control means for an explosive mine, wherein the magnetometer is insensitive to apparent changes in the earth's magnetic field as result from a spinning motion of the mine about a selected spin axis.

Other objects and advantages of the present invention will become apparent to those skilled in the art from a consideration of the following detailed description of certain illustrative examples of the invention, had in conjunction with the accompanying drawings in which like reference characters refer to like or corresponding parts, and wherein:

FIGS. 4–6 are illustrations of modified shapes for sensors embodying the principles of the present invention.

Figure 1:
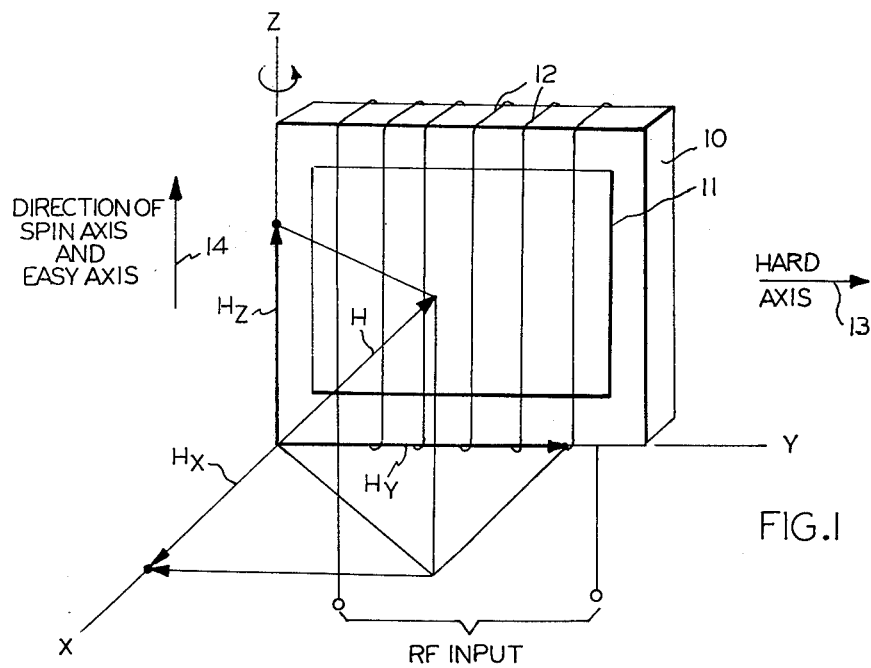
FIG. 1 is an illustrative embodiment of a prior art thin film magnetometer sensor, including a vector diagram of an ambient magnetic field in which the unit is intended to operate.

Referring to FIG. 1, a known type of thin film magnetometer sensor is shown having a flat or planar configuration. This sensor comprises a flat inert substrate plate 10, which may be a ceramic or other suitable material, and on one surface is a vapor deposited thin film 11 of magnetic material, such as Permalloy. An RF coil 12 is wound around the film 11 and its substrate 10. The film 11 is initially deposited on the substrate 10 in the presence of an appropriate magnetic field to possess the uniaxial anisotropy referred to above. The direction of the hard axis is indicated by arrow 13, and lies in the plane of the film parallel with the axis of the coil 12; while the direction of the easy axis is perpendicular thereto, also in the plane of the film 11, and is indicated by the arrow 14.

The thin film 11 thus functions as a core for the coil 12, and therefore affects the inductance value of the coil. This inductance value is a function of the external or ambient magnetic field applied to the sensor. A small change in this magnetic field causes a relatively large change in the inductance of the coil 12, and the detection of this change by means of an RF signal applied to the coil provides the magnetometer output. A circuit for detecting this change in inductance is generally illustrated in the functional block diagram of FIG. 3.

Figure 2:
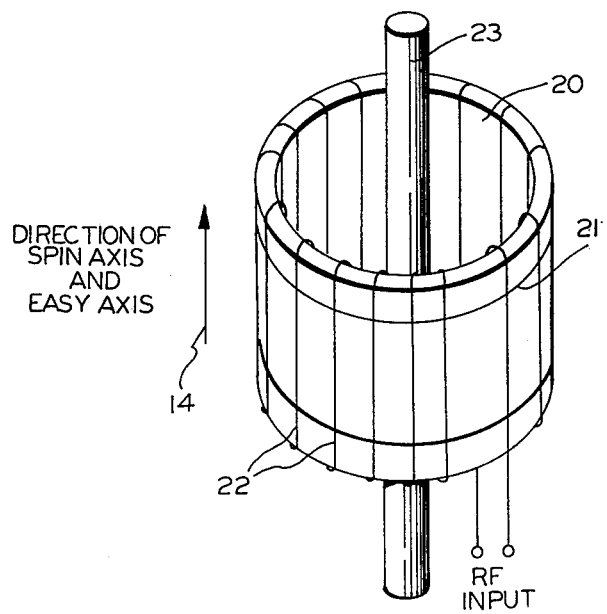
FIG. 2 is a preferred embodiment of a thin film magnetometer sensor embodying the principles of the present invention.
Figure 3:
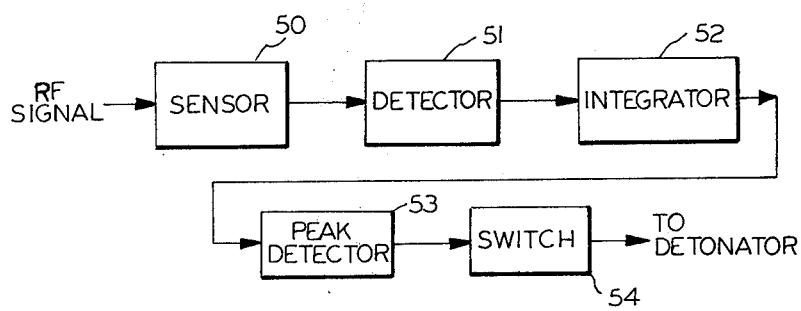
FIG. 3 is a functional block diagram of a circuit for utilizing a sensor as illustrated in FIGS. 1 or 2.

The sensor represented by block 50 in FIG. 3 includes the ferromagnetic thin film 11 and coil 12 of FIGS. 1 or 2. The coil comprises the inductance of a tuned tank circuit excited by an RF signal input. The parameters of the tank circuit are selected so that the frequency of the exciting signal falls on the slope of the circuit's resonance curve. Therefore, the RF voltage developed across the tank circuit varies with the inductance value of coil 12, which in turn is a function of the ambient magnetic field. This voltage is applied to a detector 51 designed to pass only a peak portion of each cycle of the RF signal, and this detected signal is converted to a steady state DC signal by an integrator 52. So long as the ambient magnetic field operating on sensor 50 remains constant, the DC signal output obtained from integrator 52 remains substantially constant. However, a change in the ambient magnetic field causes a significant change in the inductance value of coil 12, which results in a change in the output of detector 51 and a corresponding change in the DC voltage output of integrator 52. When the latter value deviates beyond selected limits, peak detector 53 actuates a switch 54.

As previously stated, this magnetometer can be utilized to detect the proximate appearance of a large metal body, such as a tank or other military vehicle, because of the effect these bodies have on the earth's ambient magnetic field. Consequently, this sensor can be used as the fuzing or triggering device for an explosive land mine, and in such instance the switch 54 activates the detonating circuit for the mine's explosive charge.

The foregoing system operates adequately as a military mine sensor once the mine is set; but it is often desired to sow a mine field by air drop, and in order to stabilize the mine orientation in its descent, it is customary to provide a stabilizing spin for the falling mine. The three dimensional vector presentation incorporated in FIG. 1 illustrates how the sensor of FIG. 1 would produce a signal, simply from spin, that could trigger the mine. The Z axis designated in FIG. 1 represents the axis of spin (or a line parallel to the axis of spin) for the mine and sensor, and is parallel to the easy axis 14; the Y axis is parallel to the hard axis 13; and the X axis is perpendicular to both the Y and Z axes. The earth's magnetic field is represented by the resultant arrow H, and its x, y and z components are represented by the vectors Hx, Hy and Hz, respectively. With Z as the spin axis, it will be apparent that the magnetic field vector Hz is constant during spin. The vector Hx being perpendicular to the plane of the film 11, spin has no noticeable effect on it. However, the vector Hy varies sinusoidally, producing a spin modulation that affects the magnetic properties of the film 11, and can produce a false firing signal in the sensor output.

In its preferred form, the present invention essentially eliminates this spin modulation signal by forming the magnetic thin film as a continuous or endless loop in the x, y plane. One specific embodiment of the invention is illustrated in FIG. 2. As there shown, the sensor is formed as a cylinder having a cylindrical substrate carrying the cylindrical magnetic thin film 21 on its surface. The film 21 is circumambiently continuous around the substrate, and is initially deposited with magnetic parameters equivalent to those of the film 11 in FIG. 1. I.e., the easy axis 14 for film 21 has the same orientation as in FIG. 1; and because of the cylindrical configuration, the hard axis for film 21 is at all points tangential to the surface of the film and normal to the easy axis. The planned spin axis for film 21 is parallel with its easy axis. The detection coil 22 is arranged as a toroidal winding about the substrate and thin film. Because of the axial symmetry thus provided for the film 21 and its toroidally wound coil 22, the inductance of the sensor due to the hard axis components is nearly constant and substantially independent of spin about an axis parallel to said axis of symmetry, as long as the angle between the spin axis and the earth's field is fixed. Small variations in this angle will not cause significant changes in the sensor output.

These thin film magnetometers normally operate in the presence of a biasing magnetic field applied parallel to the easy axis by permanent magnets. For simplicity of illustration, the biasing magnets are omitted from the showing of the prior art structure in FIG. 1, but a suitable illustrative biasing magnet 23 is illustrated in FIG. 2.

Although the form of the sensor shown in FIG. 2 is the surface of revolution generated by a straight line parallel to the axis of revolution, this is not essential. The line can be a curved line or a wavy line, or a line defining any function, and it need not be parallel to the axis of revolution. However, the radius of revolution at any point along the axis of revolution, should preferably be constant, or substantially so. In other words, the configuration of the sensor should be substantially symmetrical about its axis, so that a section through the sensor taken on a plane normal to its axis would define a circle, or a figure approximating a circle, with said axis as the center. For the purposes of the present specification and claims, all such surfaces of revolution are considered as embraced by the term "cylindrical surface". Although the closed loop configuration is considered the preferred form of the invention, as a practical matter the loop may terminate in a small gap between two ends, if a small spin signal can be tolerated.

To illustrate other forms of sensor configurations that may be employed for the substrate and magnetic thin film in accordance with the present invention, a number of suitable shapes are suggested in FIGS. 4-6, and in each instance a suitable planned spin axis is indicated. It will be observed that in the case of FIG. 4, the truncated spherical form provides the additional feature of rendering the sensor insensitive to changes in spin axis angle, within limits. FIG. 5 illustrates a sinuous cylindrical surface; and FIG. 6 is an example of a non-cylindrical surface, wherein the two ends of the loop terminate with a small gap 61 therebetween. Other suitable shapes will be readily apparent to those skilled in the art.

Accordingly, from the foregoing description of the present invention it will be appreciated that there is provided an improvement in thin film magnetometers, particularly in such magnetometers as are intended to respond to changes in the earth's or other ambient magnetic field, but which are subject to spin during at least some phase of their use. The teachings of the present invention enable the magnetometer to differentiate between an actual change in the ambient magnetic field, and the apparent changes that would result from spin of the sensor in a stable field. It is understood that the specific forms of the invention suggested herein are merely intended to be illustrative, and that many modifications and variations will be apparent to those skilled in the art. Such modifications and variations as are embraced by the spirit and scope of the appended claims are contemplated as being within the purview of the invention.

What is claimed is:

1. A magnetometer comprising a substrate, a thin film of ferromagnetic material carried by said substrate, said film having the property of uniaxial anisotropy in the plane of the film providing a magnetic easy axis and a magnetic hard axis normal to each other, and an electrical coil wound about said film and substrate along a dimension in the plane of said film normal to said easy axis, said film having a loop configuration with substantial symmetry about an axis substantially parallel with said easy axis, said coil having a substantially toroidal configuration substantially symmetrically disposed about said symmetry axis, means for energizing said coil with an a.c. electrical signal, and output means for sensing changes in the impedance of said coil, whereby the impedance of said coil remains substantially unchanged as result of spin of said substrate, film, and coil about said symmetry axis in a stable ambient magnetic field.

2. A magnetometer as set forth in claim 1, wherein said film loop configuration is a continuous cylindrical surface.

3. A magnetometer as set forth in claim 1, wherein said film loop configuration terminates in two adjacent ends spaced from each other by a small gap.

4. A magnetometer as set forth in claim 1, wherein the configuration of said film along a line parallel with said film axis is a straight line.

5. A magnetometer as set forth in claim 1, wherein the configuration of said film along a line parallel with said film axis is arcuate.

6. A magnetometer as set forth in claim 1, wherein the configuration of said film along a line parallel with said film axis is sinuous.

* * * * *